United States Patent
Lautenschläger et al.

(10) Patent No.: US 10,153,419 B2
(45) Date of Patent: Dec. 11, 2018

(54) COMPONENT FOR ELECTRICALLY CONTACTING A PIEZO STACK, A PIEZO STACK, AND METHOD FOR PRODUCING THE SAME

(71) Applicant: Continental Automotive GmbH, Hannover (DE)

(72) Inventors: Alexandra Lautenschläger, Fiedenburg Flügelsberg (DE); Marcus Unruh, Regensburg (DE); Claus Zumstrull, Regenstauf (DE)

(73) Assignee: Continental Automotive GmbH, Hannover (DE)

( * ) Notice: Subject to any disclaimer, the term of this patent is extended or adjusted under 35 U.S.C. 154(b) by 490 days.

(21) Appl. No.: 15/026,744

(22) PCT Filed: Jul. 6, 2015

(86) PCT No.: PCT/EP2015/065360
§ 371 (c)(1),
(2) Date: Apr. 1, 2016

(87) PCT Pub. No.: WO2016/008756
PCT Pub. Date: Jan. 21, 2016

(65) Prior Publication Data
US 2016/0254435 A1     Sep. 1, 2016

(30) Foreign Application Priority Data
Jul. 18, 2014   (DE) .................. 10 2014 214 018

(51) Int. Cl.
*H01L 41/083*     (2006.01)
*H01L 41/22*      (2013.01)
(Continued)

(52) U.S. Cl.
CPC ...... *H01L 41/0472* (2013.01); *H01L 41/0475* (2013.01); *H01L 41/083* (2013.01); *H01L 41/293* (2013.01)

(58) Field of Classification Search
CPC . H01L 1/0472; H01L 41/0475; H01L 41/083; H01L 41/293
(Continued)

(56) References Cited

U.S. PATENT DOCUMENTS

| 6,507,140 B1 | 1/2003 | Heinz et al. |
| 7,259,504 B2 | 8/2007 | Schurz |

(Continued)

FOREIGN PATENT DOCUMENTS

| CN | 1878948 A | 12/2006 |
| CN | 101647131 A | 2/2010 |

(Continued)

OTHER PUBLICATIONS

Chinese Office Action for Chinese Application No. 201580003173.1, dated Nov. 17, 2017, including English translation, 21 pages.

(Continued)

*Primary Examiner* — Thomas Dougherty
(74) *Attorney, Agent, or Firm* — RatnerPrestia (57) ABSTRACT

A piezo component with a contacting component for electrically contacting a piezo stack. The contacting component has an electrically conductive meandering structure for bringing the contacting component into electric contact with inner electrodes of the piezo stack and an electrically conductive contacting device for electrically contacting the contacting component from outside the piezo stack. The meandering structure and the contacting device are arranged at a distance from each other, and a connection element is provided in order to connect the contacting device and the meandering structure in an electrically conductive manner (Continued)

and simultaneously decouple forces between the contacting device and the meandering structure.

19 Claims, 10 Drawing Sheets

(51) Int. Cl.
   *H01L 41/047* (2006.01)
   *H01L 41/293* (2013.01)
(58) Field of Classification Search
   USPC .......................... 310/366; 29/25.35
   See application file for complete search history.

(56) References Cited

U.S. PATENT DOCUMENTS

| | | | |
|---|---|---|---|
| 7,385,337 B2 | 6/2008 | Mochizuki et al. |
| 7,612,487 B2 | 11/2009 | Dollgast et al. |
| 7,851,979 B2 | 12/2010 | Kronberger |
| 8,237,333 B2 | 8/2012 | Dorner-Reisel |
| 8,441,175 B2 | 5/2013 | Gabl et al. |
| 9,214,620 B2 | 12/2015 | Brantweiner et al. |
| 9,214,621 B2 | 12/2015 | Gerletz |
| 2006/0091766 A1 | 5/2006 | Mochizuki |
| 2007/0032132 A1 | 2/2007 | Dollgast |
| 2009/0127982 A1 | 5/2009 | Praino |

FOREIGN PATENT DOCUMENTS

| | | |
|---|---|---|
| DE | 19945933 | 5/2001 |
| DE | 10352773 A1 | 6/2005 |
| DE | 102005028495 A1 | 3/2006 |
| DE | 102005045229 | 3/2007 |
| DE | 102007051134 | 3/2009 |
| DE | 102008058011 A1 | 2/2010 |
| DE | 102010022925 | 12/2011 |
| DE | 202014100666 U1 | 2/2014 |
| DE | 202014100666 | 4/2014 |
| JP | 2005538677 A | 12/2005 |
| JP | 2007520065 A | 7/2007 |
| JP | 2011003574 A | 1/2011 |
| JP | 2012504858 A | 2/2012 |
| JP | 2012533897 A | 12/2012 |
| WO | 02073656 A2 | 9/2002 |
| WO | 2004027887 | 4/2004 |
| WO | 2005074050 A2 | 8/2005 |
| WO | 2005124884 A1 | 12/2005 |
| WO | 2010066212 A1 | 6/2010 |
| WO | 2010076116 A1 | 7/2010 |
| WO | 2013115341 A1 | 8/2013 |

OTHER PUBLICATIONS

German Examination Report for German Application No. 10 2014 214 018.8, dated Aug. 8, 2018, 8 pages.
German Examination Report for German Application No. 10 2014 214 018.8 dated May 27, 2015.
International Search Report for International Application No. PCT/EP2015/065360 dated Sep. 17, 2015.
Written Opinion of the International Searching Authority for International Application No. PCT/EP2015/065360 dated Sep. 17, 2015.
Notification of Reasons for Refusal for Japanese Application No. 2016-535170, dated Jun. 5, 2017, including English translation, 7 pages.

COMPONENT FOR ELECTRICALLY CONTACTING A PIEZO STACK, A PIEZO STACK, AND METHOD FOR PRODUCING THE SAME

CROSS REFERENCE TO RELATED APPLICATIONS

This application is the U.S. National Phase Application of PCT International Application No. PCT/EP2015/065360, filed Jul. 6, 2015, which claims priority to German Patent Application No. 10 2014 214 018.8, filed Jul. 18, 2014, the contents of such applications being incorporated by reference herein.

FIELD OF THE INVENTION

The invention relates to a piezo component, to a contacting component for the electrical contacting of a piezo stack, and to a method for producing a piezo component of said type.

BACKGROUND OF THE INVENTION

Piezoceramic stacks, also referred to as piezo stacks, which are commonly used in drives of fuel injectors, are commonly composed of a multiplicity of piezoelectric elements, for example ceramic layers, which are stacked one above the other. Commercially available piezo stacks commonly have more than 300 such ceramic layers. To generate a change in length of the piezo stack, the so-called stroke, the elements are subjected to an electric field. The piezoelectric effect has the effect here that the piezoceramic expands. The sum of the expansions of the individual piezo stack layers yields the stroke of the piezo stack as a whole. The electric field is generated by way of so-called inner electrodes which are arranged above and below each individual ceramic layer. Thus, a positive and a negative inner electrode are situated in alternating fashion between the individual ceramic layers, said electrodes being cyclically charged with electrical charge and discharged again. The contacting of the inner electrodes is realized generally by way of an external metallic coating on side faces of the piezo stack. The external metallic coating makes contact here in each case with only every second inner electrode, offset in each case by one electrode in relation to the opposite external metallic coating.

With the cyclic expansion of the piezo stack, expansion cracks arise in the ceramic and in the external metallic coating over the service life of the piezo component as a whole. For example, a common number of length change cycles over the service life of a piezo actuator amounts to more than $10^9$ cycles. The cracks that form can lead to a disruption of the electrical contacting or of the inner electrodes suspended via the cracks, and thus impair or even prevent the change in length of the piezo stack.

Each active layer, that is to say each positive and negative inner electrode, which is intended to generate an electrical field for the ceramic layer situated in between, should therefore, where possible, be permanently contacted. This prerequisite should be satisfied even in the edge zones at the upper and lower end faces of the piezo stack. Since the piezo stack end faces generally exhibit mechanical contact with adjoining components composed of metal, the remaining spacing for electrical insulation with respect to the adjoining metallic components is often very small. A requirement with regard to the contacting is therefore very highly precise positioning during the assembly process, in order that it is thus preferably ensured that a subsequently applied insulation insulates both the contacting of the inner electrodes and the side faces of the piezo stack in a reliable manner in terms of the process and to an adequate extent.

Normally, the contact points between the ceramic inner electrodes or the external metallic coating and a contacting attached thereto are sensitive with regard to mechanical loads, for example tensile loads, shear forces or vibrations. In general, it is therefore demanded that such loads on the contact points at the ceramic surface be avoided. However, the avoidance of such loads is often not possible.

Figure 17:
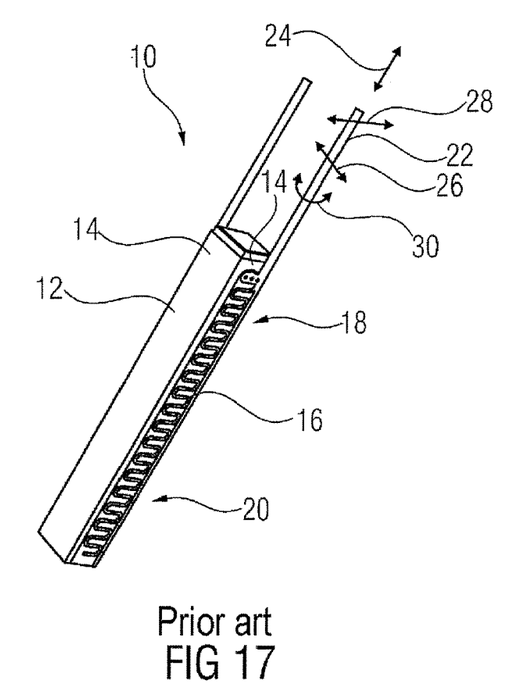
FIGS. 17 and 18 show a piezo component according to the prior art.
Figure 18:
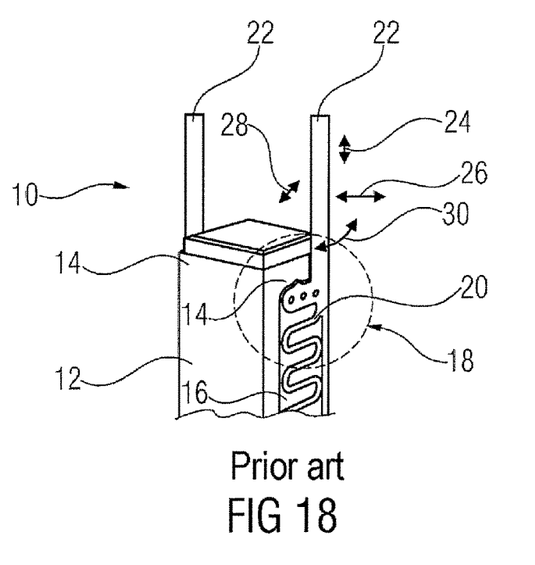

FIG. 17 and FIG. 18 shows a piezo component 10 according to the prior art.

The piezo component 10 has a piezo stack 12 which is electrically contacted at two mutually opposite side faces 14 by way of an external metallic coating 16. Here, the contacting 18 is realized by way of a first contacting element 20, which is applied directly to the external metallic coating 16, and a second contacting element 22 which, in the upper region of the piezo stack 12, is in direct contact with the first contacting element 20 and which extends beyond the piezo stack 12 in order that it can thus be contacted from the outside.

As can be seen in FIG. 18, the second contacting element 22 can be acted on by forces from the outside, specifically for example axial forces 24, radial forces 26, lateral forces 28 and torsional forces 30. Since the second contacting element 22 is directly connected to the first contacting element 20 in the circled region, such forces are transmitted directly to the first contacting element 20. This can result, in particular in the upper region of the piezo stack 12, in detachment of the contacting element 20. The forces may however also propagate further downward in the first contacting element 20 and lead to undesired detachments of the contacting 18 there too.

SUMMARY OF THE INVENTION

An aspect of the invention proposes a contacting for a piezo stack, which contacting is less sensitive with respect to forces acting from the outside.

The coordinate claims relate to a contacting component and a method for producing a piezo component of said type.

A piezo component has a piezo stack with a multiplicity of piezoelectric elements which are stacked one above the other in a longitudinal direction of extent of the piezo stack and which have interposed electrode layers for forming inner electrodes, and a contacting component for the electrical contacting of the piezo stack. The contacting component has an electrically conductive meandering structure for establishing electrical contact between the contacting component and the inner electrodes and has an electrically conductive contacting device for the electrical contacting of the contacting component from outside the piezo stack. The meandering structure and the contacting device are arranged spaced apart from one another. A connecting element is provided for the electrically conductive connection of the contacting device and of the meandering structure and for the decoupling, in terms of forces, between the contacting device and the meandering structure.

Through the use of the contacting component, it is possible for contacting of the inner electrodes of the piezo stack to be realized reliably over a long service life, because forces which act on the contacting device of the contacting component from the outside are, owing to the specially designed connecting element, no longer transmitted to the meandering structure, such that the latter cannot become detached from the inner electrodes under the action of forces acting from the outside.

Piezo stacks normally advantageously have an inactive region and an active region, wherein the inactive region is used for the insulation of the piezo stack. To achieve particularly good contacting of the active region of the piezo stack, the meandering structure preferably extends over the entire active region in the direction of longitudinal extent of the piezo stack.

The meandering structure is preferably arranged in direct contact with the piezo stack, while the contacting device and the connecting element are arranged so as to be spaced apart radially from the piezo stack. In this way, it is advantageously ensured that only the meandering structure produces electrical contact with the inner electrodes of the piezo stack. Since both the connecting element and the contacting device are spaced apart from the piezo stack, there is preferably no risk of undesired, adverse contacting occurring between the contacting device and the inner electrodes.

The meandering structure is preferably adhesively bonded, in particular using conductive adhesive, to a side face of the piezo stack. Here, the side face may or may not have an external metallic coating. It is alternatively also possible for the meandering structure to be soldered to an additionally applied external metallic coating on the piezo stack. It is thus possible in each case to realize advantageous reliable electrical contacting between meandering structure and inner electrodes of the piezo stack.

The piezo stack advantageously has at least four side faces which are connected to one another via corner regions. Here, the meandering structure is preferably arranged on a first side face, wherein the contacting device is advantageously arranged on a second side face which is preferably adjacent to the first side face. Here, the connecting element extends around an end region which preferably connects the first and the second side face to one another. In this way, the contacting device is arranged so as to be offset with respect to the meandering structure by substantially 90°, specifically preferably such that the contacting device is situated on that side face of the piezo stack which does not have an external metallic coating but which has, for example, an insulation face. This yields advantageously adequate leakage current paths on the surface of the insulation face.

The piezo stack advantageously has a first and a second termination region, wherein the contacting device extends beyond at least one of the termination regions. In this way, the contacting device can be contacted from the outside in an advantageously effective manner.

It is particularly preferable for the contacting device, in the region in which it extends beyond the termination region, to have an insulation sleeve in order that, in a particularly advantageous manner, it can insulate the contacting device from other elements of the piezo component.

It is particularly preferable if this insulation sleeve extends into a spacing which is formed between a branch element on the contacting device and the contacting device itself. An insulation sleeve is then advantageously realized, which insulates as large as possible a region of the contacting component and exposes only an upper region of the contacting component for advantageous contacting from the outside.

In order to be able to achieve advantageously particularly good electrical contacting of the inner electrodes of the piezo stack, it is preferable for two contacting components to be provided, the meandering structures of which are arranged in each case on mutually opposite side faces, in particular on side faces equipped with an external metallic coating, of the piezo stack.

It is furthermore advantageous for the piezo stack to be a fully active piezo stack, because in this way, it is possible to realize as large a stroke as possible upon the application of an electric field.

The piezo stack and the contacting component fastened thereto are preferably surrounded by a plastics cage for insulation purposes.

Furthermore, the piezo component advantageously has, for insulation purposes, an encapsulation, formed in particular with silicone, around the piezo stack with the contacting component and the optional plastics cage.

A contacting component for the electrical contacting of a piezo stack has an electrically conductive meandering structure for establishing electrical contact between the contacting component and inner electrodes of the piezo stack, and has an electrically conductive contacting device for the electrical contacting of the contacting component from outside the piezo stack. The meandering structure and the contacting device are arranged spaced apart from one another. Furthermore, a connecting element is provided for the electrically conductive connection of the contacting device and of the meandering structure and for the decoupling, in terms of forces, between the contacting device and the meandering structure.

A meandering structure which is provided for the contacting of the inner electrodes can expand with the stroke of the piezo stack upon application of an electric field, and can contract, such that it is already possible in this way to prevent the detachment of a contacting. To now also prevent a situation in which forces acting on the contacting device from the outside lead to a detachment of the meandering structure, the meandering structure is now decoupled from the contacting device with regard to acting mechanical forces. For this purpose, the meandering structure and contacting device are arranged spaced apart from one another. In this way, forces acting on the contacting device are no longer transmitted to the meandering structure.

To provide an electrically conductive connection between contacting device and meandering structure, a connecting element is arranged between meandering structure and contacting device. Said connecting element is designed such that forces acting on the contacting device cannot be transmitted to the meandering structure, such that the decoupling in terms of forces between the meandering structure and contacting device is maintained despite the electrical connection.

Correspondingly, a combination of a meandering structure, which is capable of expanding in a direction of longitudinal extent of the piezo stack, with a force-decoupling connecting element is provided.

By way of the meandering structure, which is of coherent unipartite form and which can be attached to the surface of the piezo stack, it is also possible to avoid the provision of free individual connections, as is known in part in the prior art. In this way, precise positioning on the surface of the piezo stack is possible. The meandering geometry is elastic under tensile and bending loads and therefore adapts to the change in length of the piezo stack, that is to say to the piezo stroke.

A further advantage lies in the spacing of the meandering structure from the contacting device. This geometrically remote arrangement yields, with regard to an electrical insulation that is normally provided on a piezo component, adequate leakage current paths on the surface of said insulation, and thus considerably improved possibilities with regard to construction.

The contact which extends to the outside, that is to say the contacting device, automatically has a spacing to the piezo stack, without the need, such as exists in the prior art, for sensitive Z bending of the contacting adhering to the piezo stack.

It is preferably the case that the meandering structure, connecting element and contacting device are not arranged in a plane, but rather the connecting element has a bend along its direction of longitudinal extent, such that a substantially perpendicular angle is formed between meandering structure and contacting device. It is thus advantageously possible for the meandering structure to be attached to a side face of the piezo stack, on which there is provided, for example, an external metallic coating, whereas the contacting device is situated on another side face of the piezo stack, where there is for example no external metallic coating. It is thus advantageously possible to realize particularly good insulation for the prevention of flashover.

The meandering structure preferably extends in a direction of longitudinal extent of the piezo stack, wherein the contacting device is arranged substantially parallel to the direction of longitudinal extent. Owing to the preferably parallel arrangement of meandering structure and contacting device, it is possible to provide as small a connecting element as possible for preferably good contacting between the two elements. It is thus advantageously possible for structural space to be saved.

The connecting element preferably has a multiplicity of wire elements which are connected, on a first wire element side, to the meandering structure and which are connected, on a second wire element side situated opposite the first wire element side, to the contacting device. Wire elements preferably form a particularly filigree connecting means between the meandering structure and the contacting device, which can be accommodated in a particularly advantageous manner even in a constricted structural space.

It is preferable for the meandering structure to have a multiplicity of meander loops, wherein it is advantageously the case that at least two wire elements are arranged at each meander loop directed toward the contacting device. In this way, it is possible to realize preferably particularly good contacting between the meandering structure and contacting device. To be able to realize particularly good advantageous contacting between the meandering structure and contacting device, it is for example the case that approximately 70-130, in particular 90-110, wire elements, in each case in total, are arranged between the meandering structure and contacting device.

The wire elements advantageously extend substantially parallel to one another. Furthermore, the wire elements in this case preferably extend substantially perpendicular to the direction of longitudinal extent of the meandering structure. This means that the wire elements are arranged substantially perpendicular to the meandering structure and to the contacting device, such that the connecting element advantageously takes up a particularly small amount of space between the meandering structure and contacting device. The wire elements are advantageously designed for the decoupling of axial and/or radial and/or lateral and/or torsional forces between the contacting device and the meandering structure. For this purpose, it is particularly advantageous for the wire elements to be arranged between the meandering structure and contacting device in particular so as to be flexible in at least one spatial direction, preferably in two spatial directions, in particular in three spatial directions. Here, it is particularly advantageous for the wire elements to be flexible in their direction of longitudinal extent. By way of such an embodiment, external forces which act on the contacting device in an axial, radial, lateral or torsional direction are particularly advantageously no longer transmitted to the meandering structure, but rather are preferably absorbed by the wire elements.

For this purpose, it is also particularly advantageous for the wire elements to be flexurally soft. For this purpose, they may be formed for example from a copper alloy such as $CuSn_6$.

The meandering structure advantageously has, in the direction of longitudinal extent, a first end region and a second end region, wherein the contacting device protrudes at least beyond one of the end regions of the meandering structure. In this way, it is advantageously possible for the contacting device to be easily accessed from the outside, such that a preferred contacting can then be applied from the outside.

In order to advantageously be able to save further structural space, the contacting device is preferably in the form of a flat contact element.

The meandering structure and the connecting element are preferably formed in one piece. In a further advantageous refinement, both the meandering structure and the contacting device and the connecting element are formed conjointly. In this way, the production of the contacting component is preferably simplified, because the contacting component can advantageously be produced with the individual elements of meandering structure, connecting element and/or contacting device in one method step, for example by being punched out or etched out of a base structure.

It is advantageous if the meandering structure, the connecting element and the contacting device have a uniform thickness, because in this way, it is preferably possible for structural space to be optimally utilized. For this purpose, the contacting device is for example particularly advantageously in the form of a flat contact element. "Uniform thickness" means that the three individual elements extend perpendicular to the direction of longitudinal extent of the meandering structure and also perpendicular to a direction of extent of the wire elements—the wire extent direction—between the contacting device and the meandering structure in a thickness direction, and in this case preferably have the same length of extent. In the case of the flat contact element, the thickness thereof in the thickness direction is then preferably smaller than its width in the direction of wire extent.

It is particularly advantageous for the thickness of all of the elements of the contacting component to lie in a range between 0.05 mm and 0.15 mm. In this way, the contacting component as a whole advantageously takes up only a small amount of structural space in a piezo component.

It is preferably the case that, on the contacting device, in a spacing region which is arranged parallel to that end region of the meandering structure beyond which the contacting device protrudes, there is arranged a branch element. The branch element preferably extends parallel to the direction of longitudinal extent of the meandering structure and of the contacting device, and is advantageously arranged spaced apart from the contacting device with the formation of a spacing. Here, the wire elements are, in said spacing region, preferably fastened to the branch element rather than to the contacting device. Altogether, this therefore preferably also yields a spacing between the contacting device and the wire elements or the meandering structure. This is particularly advantageous if the contacting device is to be insulated during the production process, because in this way, an insulation, for example in the form of an insulation sleeve into which the contacting device is preferably to be pushed, can be drawn preferably to a great extent into the region in which the meandering structure makes contact with the inner electrodes of a piezo stack.

The branch element preferably has a web, which is fastened substantially perpendicularly to the contacting device, for forming the spacing. To be able to realize particularly good insulation, said branch web is preferably arranged such that the branch element can extend over approximately ⅕ of the length of the meandering structure.

In a method for producing a piezo component, it is firstly the case that a piezo stack is provided which has a multiplicity of piezoelectric elements stacked one above the other in a direction of longitudinal extent of the piezo stack, between which piezoelectric elements there are arranged electrode layers as inner electrodes. The piezo stack that is provided has at least four side faces which are connected to one another via corner regions. Furthermore, in the method, a contacting component as described above is formed, which has a meandering structure, a contacting device and a connecting element which electrically connects the meandering structure and the contacting device. After the piezo stack is provided and the contacting component is formed, the meandering structure of the contacting component is fastened in electrically conductive fashion to a first side face of the piezo stack such that the contacting device and the connecting element remain spaced apart from the piezo stack. Thereafter, the contacting device and the connecting element are bent so as to abut against a second side face, which is adjacent to the first side face, of the piezo stack and so as to be bent about a corner region which connects the first and the second side faces. The bending is performed such that the contacting device and the connecting element also remain spaced apart from the second side face and from the corner region.

Thus, flexible contacting of the inner electrodes of the piezo stack is realized, in the case of which only the meandering structure of the contacting device is fixedly connected to the piezo stack. To realize good insulation, the contacting device is not only spaced apart from the meandering structure in a spatial direction but is also bent around a corner and does not come into contact with the electrodes of the piezo stack. By way of the specially designed connecting element, forces acting on the contacting device from the outside are absorbed and are not transmitted to the meandering structure.

To form the contacting component, it is for example possible for use to be made of sheet metal, from which the contacting component with all of its elements, specifically meandering structure, connecting element and contacting device, is punched out or etched out. Alternatively, it is also possible for only the meandering structure and connecting element to be formed from one piece of sheet metal, and for the contacting device to be attached thereto retroactively.

The fastening of the meandering structure may be realized for example by way of adhesive bonding, with the aid of a conductive adhesive, directly to the piezo stack, or by way of soldering to, for example, an external metallic coating on the piezo stack.

With regard to the bending of the contacting device, it may be advantageous for the connecting element to be cranked at multiple locations, that is to say for a contacting component which is initially formed in one plane to have multiple bends.

For example, the region of the connecting element at the meandering structure may be cranked, in order to thereby space the connecting element apart from the piezo stack, if the meandering structure is fastened to the piezo stack. Furthermore, a cranked configuration may for example also be expedient in the region of the contacting device on the connecting element, in order to thereby facilitate bending about a corner region of the piezo stack.

It is advantageously the case that an insulation sleeve is provided on the contacting device in order to be able to insulate the contacting device preferably extensively with respect to electrically conductive components of the piezo component. Said insulation sleeve may for example be attached to the contacting device already before the latter is connected to the connecting element—if said contacting device is not formed in one piece with the meandering structure and connecting element—or before the meandering structure is attached to the piezo stack. Alternatively, the insulation sleeve may however also be attached to the contacting device when the contacting component has already been fastened to the piezo stack.

Optionally, it is possible for a plastics cage for further insulation to be arranged around the piezo stack with the contacting component that has been fastened thereto.

Subsequently, it is advantageous for the construction to be encapsulated for example with silicone. The encapsulation is particularly advantageously formed such that the insulation sleeve also extends into the encapsulation.

Finally, a tubular spring may be arranged around the encapsulation at the outside.

BRIEF DESCRIPTION OF THE DRAWINGS

Advantageous refinements of the invention will be discussed in more detail below on the basis of the appended drawings, in which.

DETAILED DESCRIPTION OF THE PREFERRED EMBODIMENTS

Figure 1:
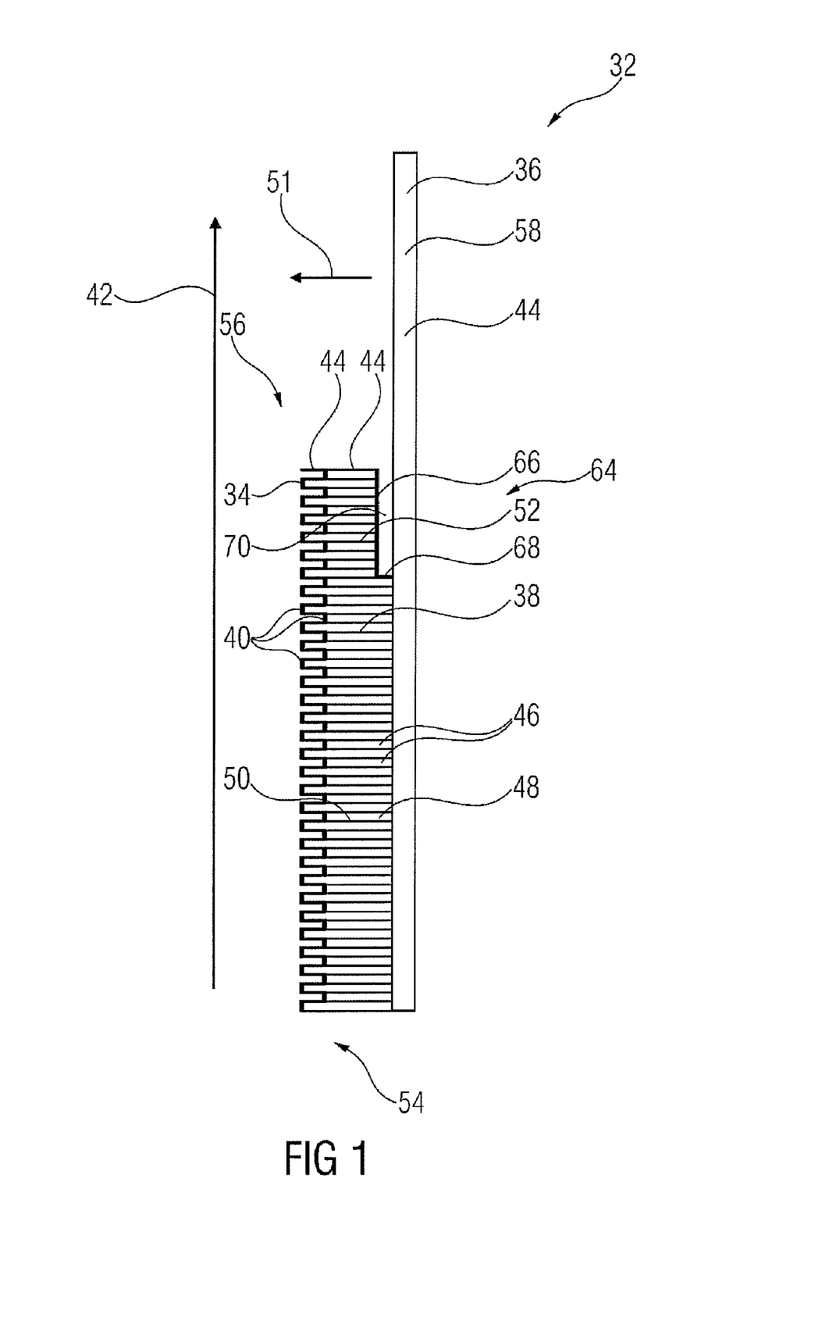
FIG. 1 shows a first embodiment of a contacting component by way of which a piezo stack can be electrically contacted.

FIG. 1 shows a contacting component 32 by way of which a piezo stack 12 can be electrically contacted.

The contacting component 32 has a meandering structure 34, a contacting device 36 and a connecting element 38. The meandering structure 34 has a multiplicity of meander loops 40 and extends in a direction of longitudinal extent 42. The meandering structure 34 is intended to be fastened, at a later point in time, to an external metallic coating 16 of a piezo stack 12. Owing to its meandering form in the direction of longitudinal extent 42, the meandering structure 34 is capable of expanding and contracting with a stroke of the piezo stack 12. The meandering structure 34 is formed from a conductive material 44.

The contacting device 32 extends parallel to the meandering structure 34 but is arranged spaced apart therefrom. For the connection of contacting devices 36 and meandering structure 34, the connecting element 38 is arranged between the meandering structure 34 and contacting device 36 and is in contact with both elements. The connecting element 38 is also formed from the electrically conductive material 44 in order to thereby be able to produce an electrical connection between the meandering structure 34 and the contacting device 36.

The connecting element 38 has a multiplicity of wire elements 46 which are connected, on a first wire element side 48, to the meandering structure 34 and, on a second wire element side 50, to the contacting device 36. The wire elements 46 extend, substantially perpendicular to the direction of longitudinal extent 42, in a wire direction of extent 51.

The wire elements 46 are flexurally soft and are thus flexible in all three spatial directions. For example, the wire elements 46 are formed from a copper alloy 52 such as for example CuSn$_6$.

The wire elements 46 can thus absorb, and thereby decouple from the meandering structure 34, axial forces 24, radial forces 26, lateral forces 28 and torsional forces 30 that can act on the contacting device 36 from the outside. The meandering structure 34 has, in the direction of longitudinal extent 42, a first end region 54 and a second end region 56. In the present embodiment, the contacting device 36 protrudes beyond the second end region 56 in order that it can be easily contacted from the outside. The contacting device 36 is also formed from the conductive material 44. To save structural space, in the present embodiment, the contacting device 36 is in the form of a flat contact element 58. In a thickness direction 59, the meandering structure 34, the connecting element 38 and the contacting device 36 therefore have approximately the same thickness 59'.

The contacting component 32, or its elements of meandering structure 34, contacting device 36 and connecting element 38, are formed in one piece in the present embodiment, for example by being punched out or etched out of an alloy sheet.

Figure 2:
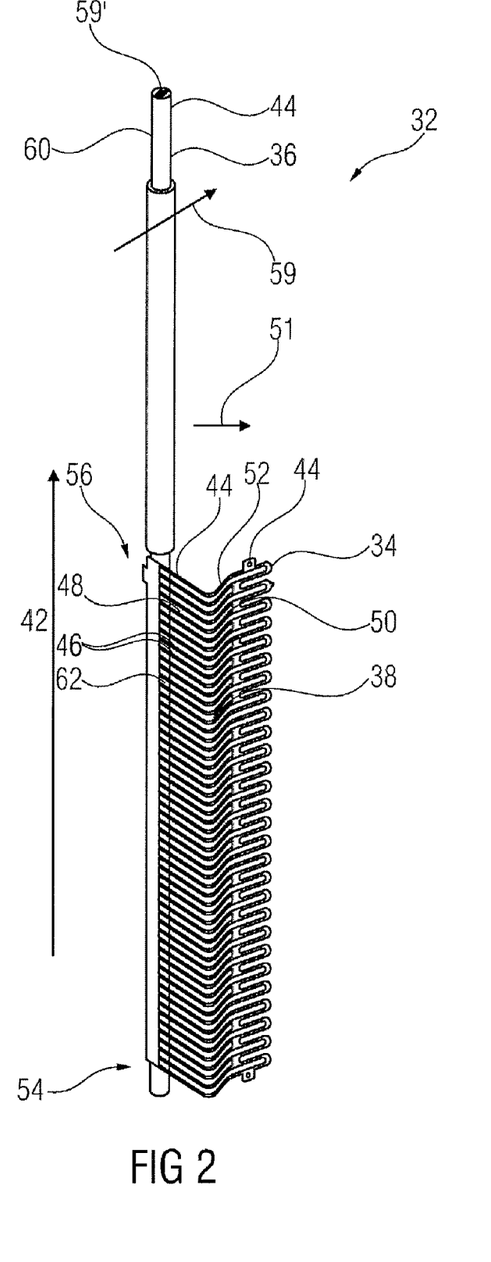
FIG. 2 shows a second embodiment of a contacting component of said type.

FIG. 2 shows a second embodiment of a contacting component 32. In this case, the meandering structure 34 is formed in one piece with the connecting element 38, but the contacting device 36 is in the form of a separate element, which is attached to the connecting element 38 for example by soldering or welding. For this purpose, the connecting element 38 has, in addition to the wire elements 46, a fastening web 62 to which the contacting device 36 can be fastened. Here, the contacting device 36 is formed not as a flat contact element 58 but as a circular contact element 60.

The contacting component 32 of the first embodiment shown in FIG. 1 additionally differs from the second embodiment of the contacting component as per FIG. 2 by a spacing of the contacting device 36 from the wire elements 46 in the upper region of the meandering structure 34. For this purpose, the contacting device 36 has, in an upper spacing region 64 which is arranged parallel to that end region 56 beyond which the contacting device 36 protrudes, a branch element 66. The branch element 66 extends parallel to the meandering structure 34 and the contacting device 36 and has a web 68 which is arranged at the lower end of the branch element 66 and which extends perpendicular to the contacting device 36. This yields a spacing 70 to the contacting device 36. In said spacing region 64, the wire elements 46 are fastened not to the contacting device 36 but to the branch element 66. In this way, an insulation element can be inserted into the spacing 70.

Figure 3:
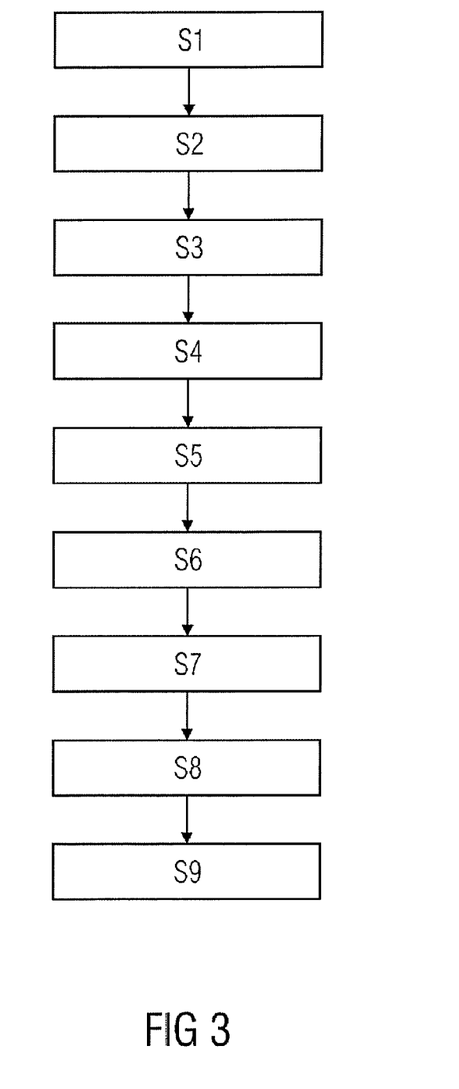
FIG. 3 shows a flow diagram of method steps for the production of a piezo component which has the contacting component from FIG. 1 and FIG. 2.
Figure 4:
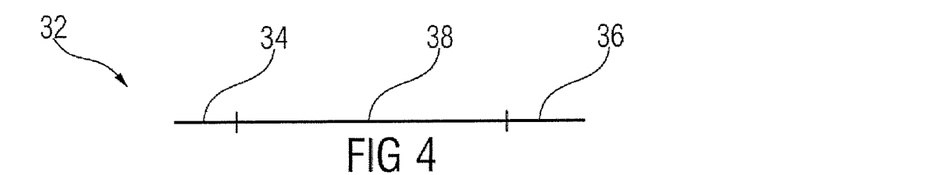
FIG. 4 shows a cross section through the contacting component from FIG. 1.

FIG. 3 shows a flow diagram illustrating the production of a piezo component 10. Here, FIGS. 4-13 serve for illustrating the method.

Firstly, in step S1, the contacting component 32 is produced. A cross section through the contacting component 32 with meandering structure 34, contacting device 36 and connecting element 38 is, in this regard, illustrated in FIG. 4.

Figure 5:
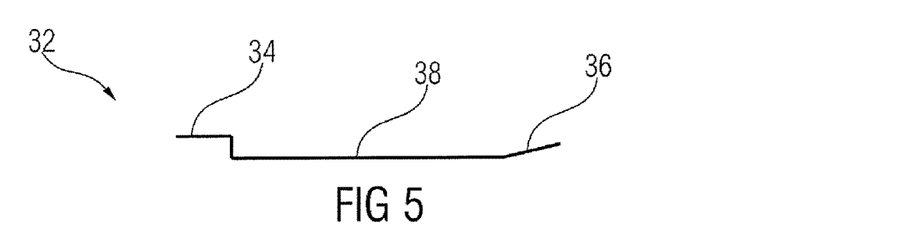
FIG. 5 shows the contacting component from FIG. 4 with a cranked configuration.

In order that the contacting component 32 can be fastened in a later point in time without significant steric obstruction, said contacting component is firstly, in a step S2, cranked in the region of the meandering structure 34 and in the region of the contacting device 36 on the connecting element 38, as shown in FIG. 5.

Figure 6:
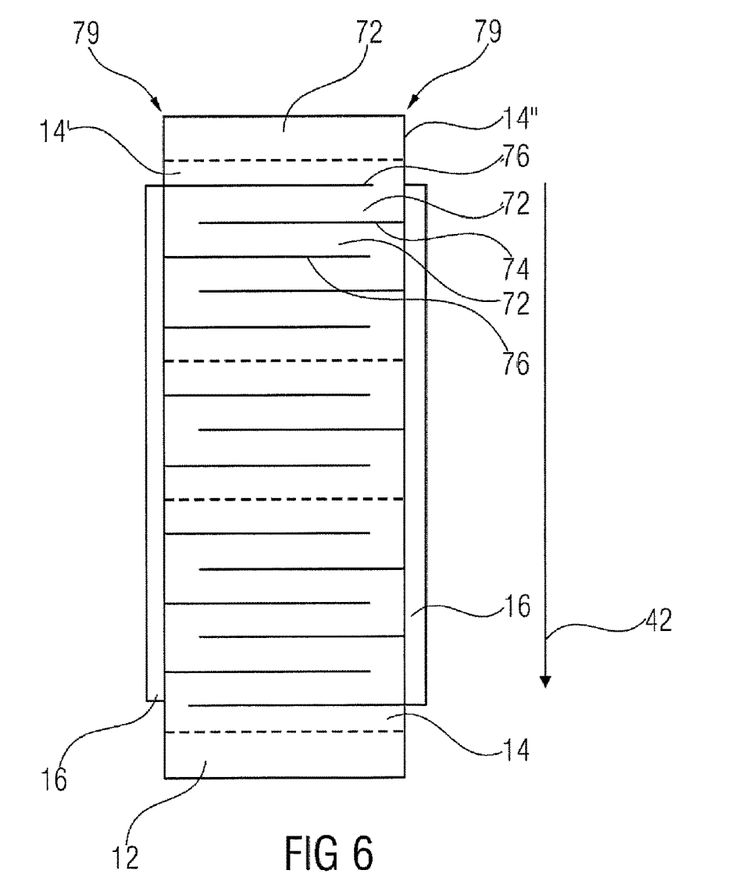
FIG. 6 shows a piezo stack for use in the method as per FIG. 3, in longitudinal section.
Figure 7:
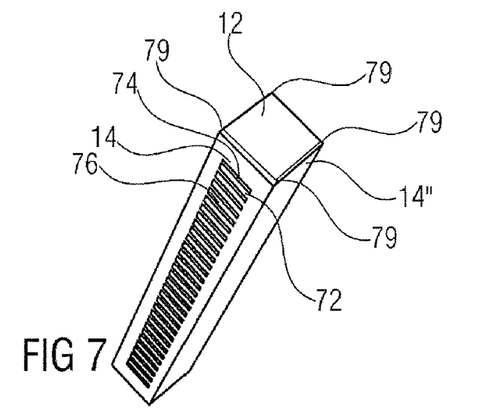
FIG. 7 shows a piezo stack for use in the method as per FIG. 3.

In a step S3, a piezo stack 12 shown in FIG. 6 and FIG. 7 is provided.

The piezo stack 12 has a multiplicity of piezoelectric elements 72 stacked one above the other in the direction of longitudinal extent 42, between which elements there are arranged electrode layers 74 as inner electrodes 76.

In the present embodiment, the piezo stack 12 has four side faces 14, 14', 14", 14''', of which three side faces 14, 14', 14" are visible. On mutually opposite side faces 14, 14', there is provided in each case an external metallic coating 16. The side face 14" does not have an external metallic coating 16.

Figure 8:
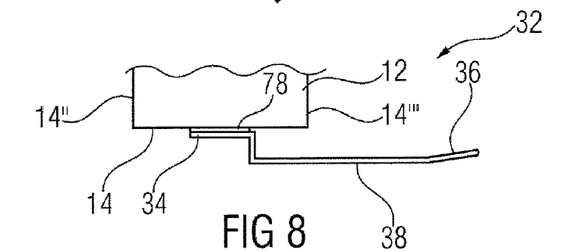
FIG. 8 shows the attachment of the cranked contacting component from FIG. 5 to the piezo stack from FIG. 6 and FIG. 7.

In a step S4 of the method, shown in FIG. 8, the cranked contacting component 32 from FIG. 5 is fastened by way of the meandering structure 34 to one of the side faces 14', 14" of the piezo stack, such that the meandering structure 34 is in contact with the external metallic coating 16.

Figure 9:
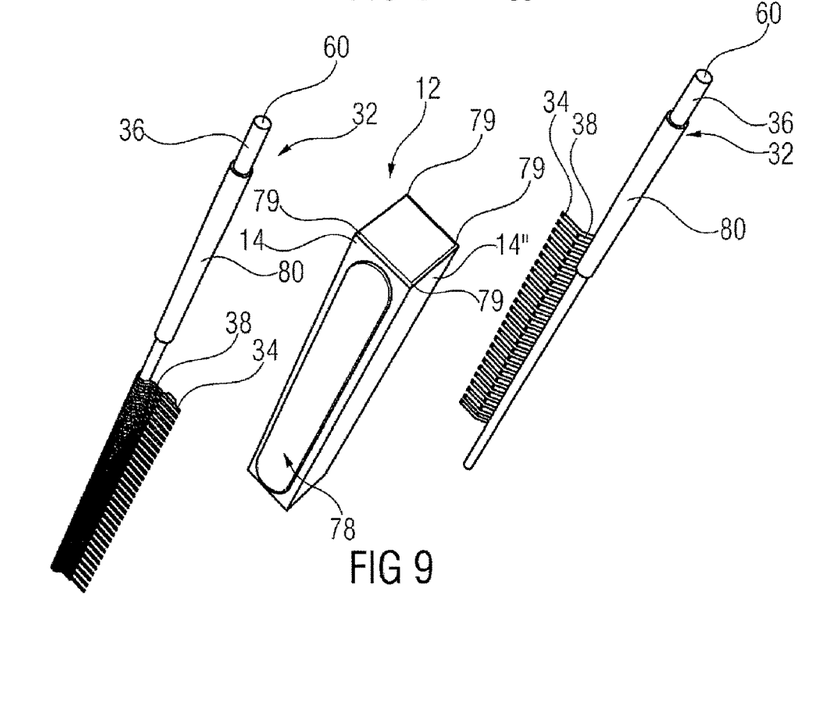
FIG. 9 shows the attachment of two contacting components to a piezo stack with an external metallic coating.

In FIG. 9, it is shown that, on two mutually opposite side faces 14', 14" of the piezo stack 12, in each case one contacting component 32 is fastened to the respective meandering structure 34, specifically by adhesive bonding by way of a layer of conductive adhesive 78. In step S4, the meandering structure 34 may also be fastened to the external metallic coating 16 by way of a solder layer rather than by adhesive bonding.

Figure 10:
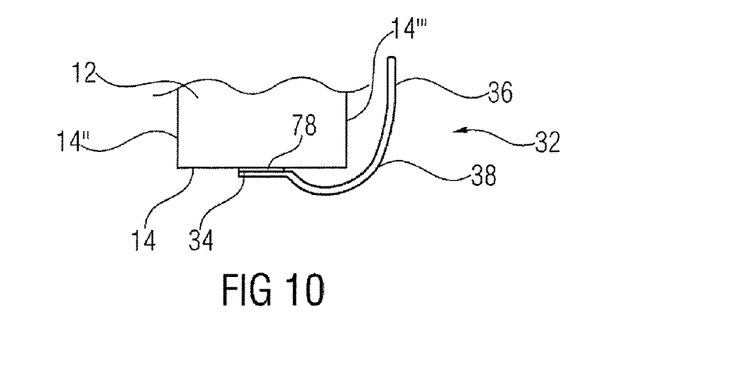
FIG. 10 shows the bending of the contacting component about a corner region of the piezo stack.

In step S5, the connecting element 38 of the contacting component 32 fastened to the piezo stack 12 is bent around a corner region 79 of the piezo stack 12, such that the contacting device 36 abuts against the side face 14" where no external metallic coating 16 is arranged. This is illustrated in FIG. 10.

Figure 11:
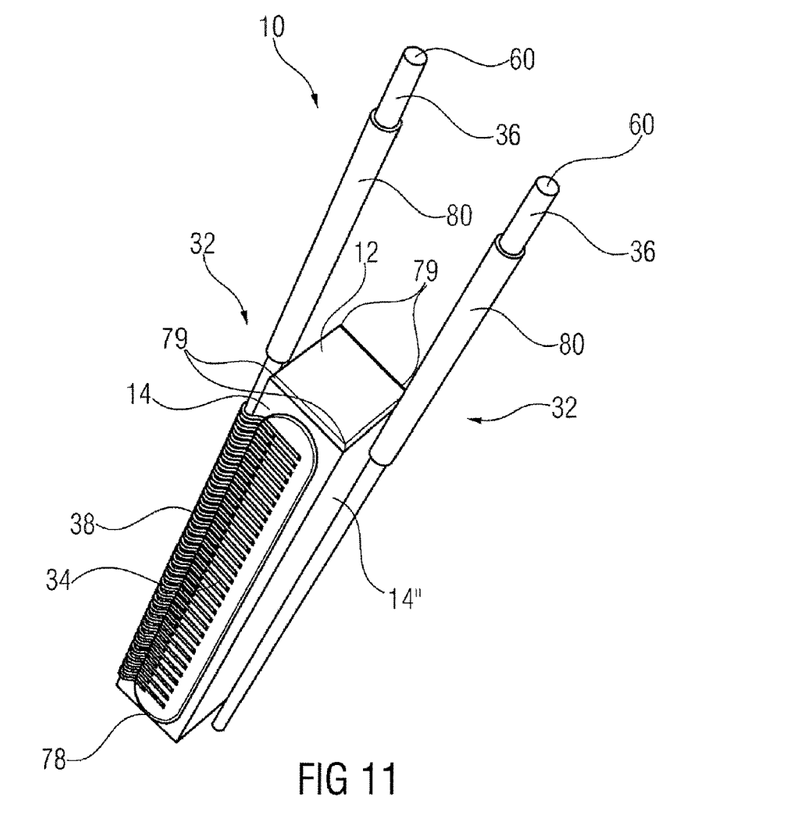
FIG. 11 shows the piezo stack from FIG. 7 with contacting component attached thereto, wherein a contacting device of the contacting component is in the form of a circular contact element.
Figure 12:
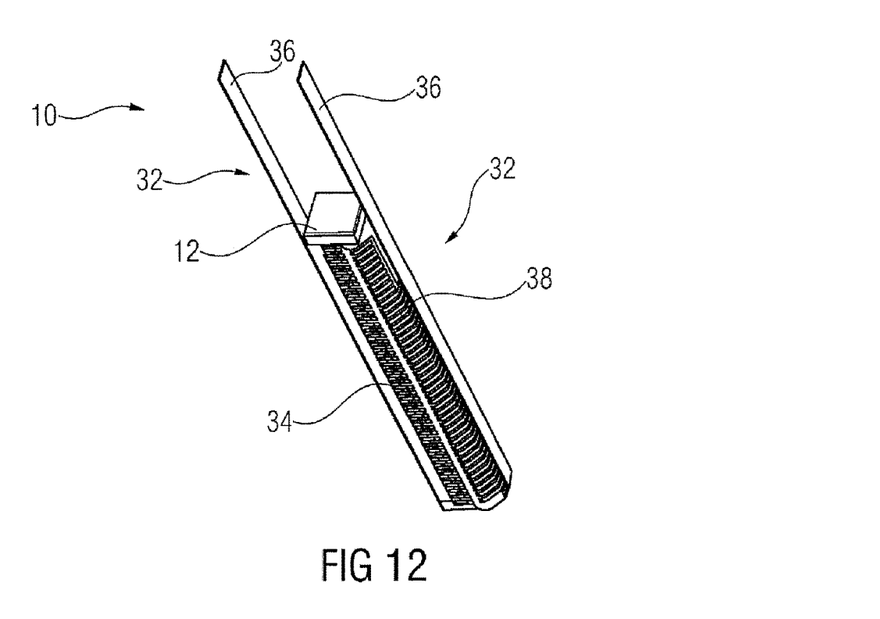
FIG. 12 shows a piezo stack with contacting component attached thereto, wherein the contacting device is in the form of a flat contact.

FIG. 11 shows a perspective view of the piezo stack 12 with bent contacting components 32 attached thereto. Here, in FIG. 11, the second embodiment of the contacting component 32 as shown in FIG. 2 has been used. It is however alternatively also possible, as shown in FIG. 12, for the first embodiment of the contacting component 32 to be used for the fastening to the piezo stack 12. As can be seen in FIG. 11 and in FIG. 12, only the meandering structure 34 is in direct contact with the piezo stack 12, whereas the connecting element 38 and the contacting device 36 are arranged spaced apart from the piezo stack.

Figure 13:
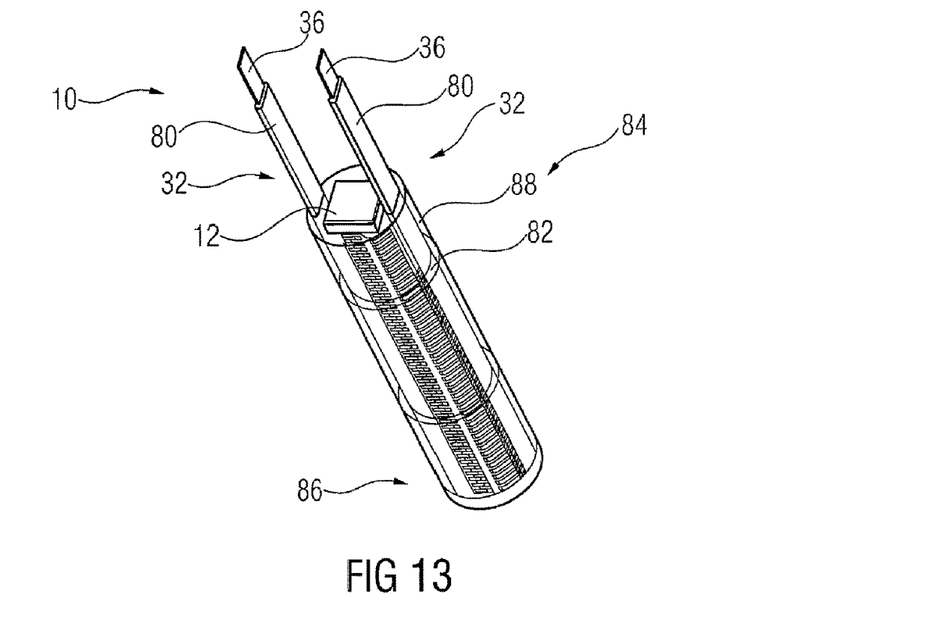
FIG. 13 shows the construction from FIG. 12 with a plastics cage arranged thereon and with an encapsulation.

In a step S6, the contacting device 36 is equipped with an insulation sleeve 80, as shown in FIG. 13. Said step S6 is optional, because the insulation sleeve 80, as shown for example in FIG. 9, may be arranged on the contacting device 36 already before the attachment of the contacting component 32 to the piezo stack 12.

In a likewise optional step S7, it is then possible for a plastics cage 82 to be arranged around the construction composed of piezo stack 12 and contacting components 32.

As can likewise be seen in FIG. 12 and FIG. 13, the piezo stack 12 has a first termination region 84 and a second termination region 86, wherein the contacting devices 36 fastened to the piezo stack 12 extend beyond the first termination region 84. The insulation sleeve 80 is also arranged in said region.

In a step S8, the entire assembly is then encapsulated with an encapsulation material 88, for example silicone.

Figure 15:
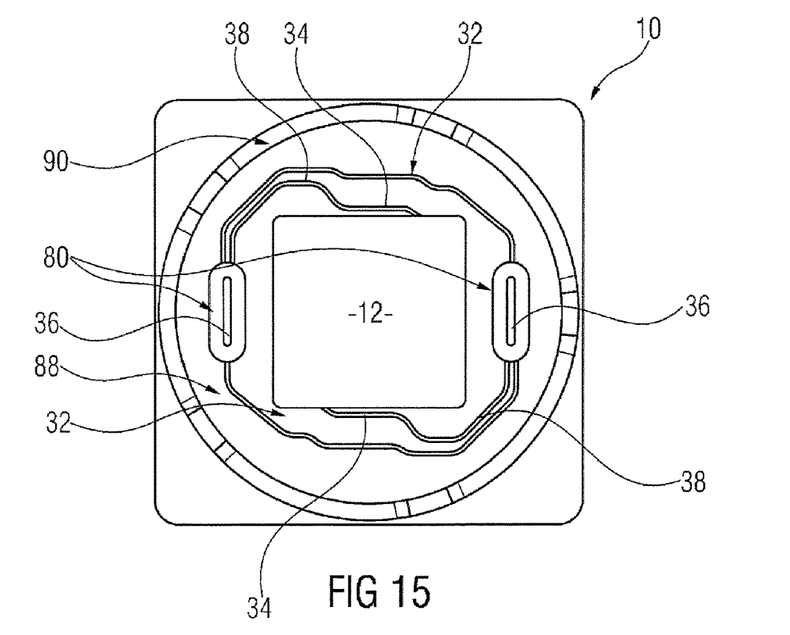
FIG. 15 shows a plan view of the construction from FIG. 13 with piezo stack, contacting component, encapsulation and tubular spring.

Finally, in a step S9, a tubular spring 90 is mounted around the overall assembly, as is shown for example in FIG. 15.

Figure 14:
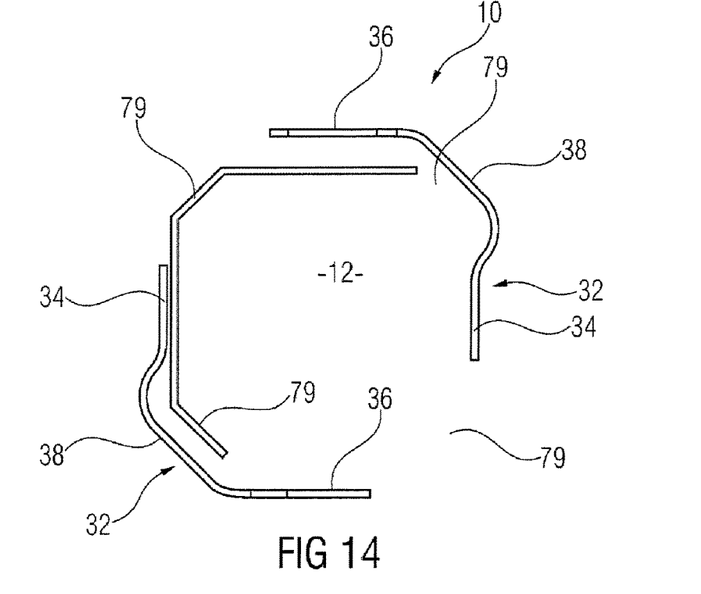
FIG. 14 shows a plan view of the piezo stack from FIG. 12 with the contacting components.

FIG. 14 illustrates a cross section through the piezo component 10, said cross section showing how two contacting components 32 are attached to a piezo stack 12, specifically such that only the meandering structure 34 is in contact with the piezo stack 12, while the connecting elements 38 and the contacting devices 36 are in each case spaced apart from the corner regions 79 and from the respective side faces 14".

FIG. 15 shows a cross section through the overall assembly of the piezo component 10, wherein the piezo stack 12 is arranged in the interior, and the contacting components 32 are attached to said piezo stack. The contacting devices 36 of the contacting components 32 in this case have insulation sleeves 80. The piezo component 10 is encapsulated with an encapsulation material 88, with a tubular spring 90 additionally being arranged around the encapsulation material 88 in order to exert a preload on the piezo component 10.

Figure 16:
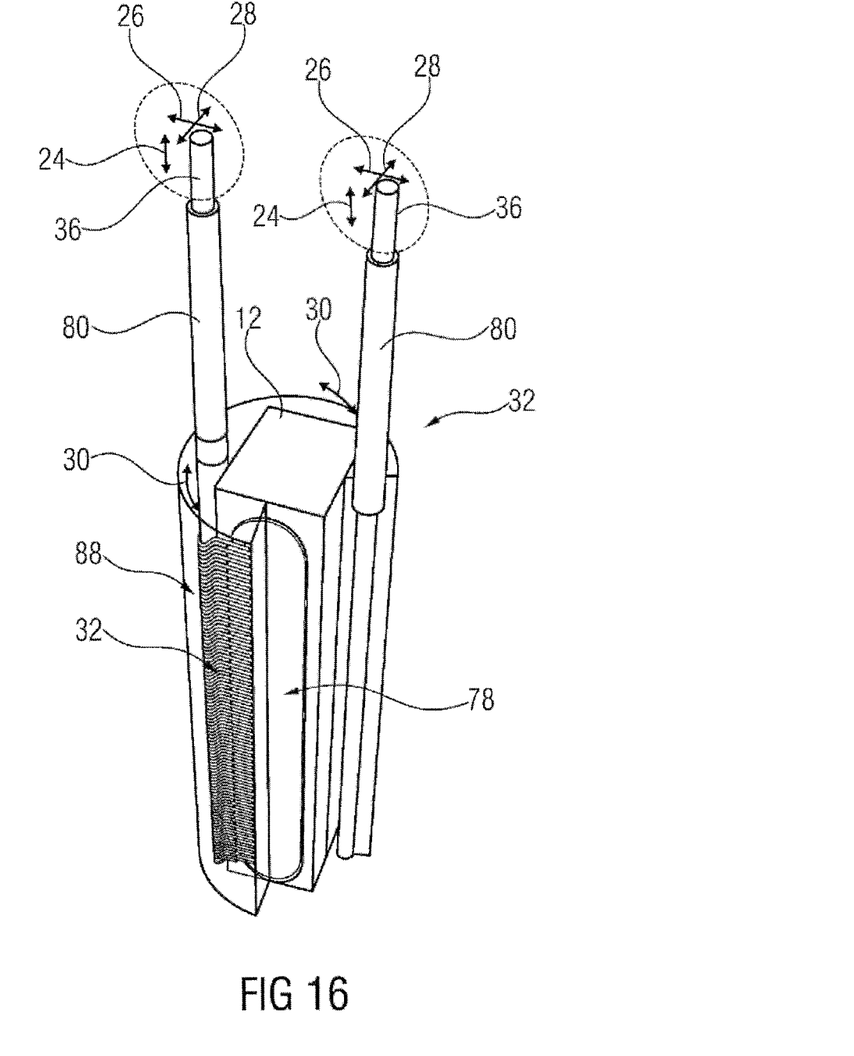
FIG. 16 shows a piezo component with forces acting thereon from the outside.

FIG. 16 shows how forces act on the contacting devices 36 of the piezo component 10 from the outside. Owing to the special construction of the contacting components 32, said forces are however no longer transmitted to the meandering structures 34, such that a detachment of the meandering structure 34 from the piezo stack 12 can be prevented.

Accordingly, a permanently elastically expandable or flexible contacting component 32 is provided which prevents the formation of cracks in the contacting of a piezo stack 12. It is therefore no longer necessary to bypass or circumvent potential cracks, as has hitherto been the case. Altogether, a situation is avoided in which forces from the surroundings which act on the contacting device 36, for example installation forces, vibrational forces during operation, forces arising as a result of thermal expansions of adjacent components etc., lead to damage to the contacting on the piezo stack surface.

LIST OF REFERENCE DESIGNATIONS

10 Piezo component
12 Piezo stack
14 Side face
14' Side face
14" Side face
14'" Side face
16 External metallic coating
18 Contacting
20 First contacting element
22 Second contacting element
24 Axial force
26 Radial force
28 Lateral force
30 Torsional force
32 Contacting component
34 Meandering structure
36 Contacting device
38 Connecting element
40 Meandering loop
42 Direction of longitudinal extent
44 Conductive material
46 Wire element
48 First wire element side
50 Second wire element side
52 Direction of wire extent
54 Copper alloy
56 First end region
56 Second end region
58 Flat contact element
59 Thickness direction
59' Thickness
60 Circular contact element
62 Fastening web
64 Spacing region
66 Branch element
68 Web
70 Spacing
72 Piezoelectric element
74 Electrode layer
76 Inner electrode
78 Conductive adhesive
79 Corner region
80 Insulation sleeve
82 Plastics cage
84 First termination region
86 Second termination region
88 Encapsulation material
90 Tubular spring
S1 Formation of a contacting component
S2 Cranking of the contacting component
S3 Provision of a piezo stack
S4 Fastening of the contacting component to the piezo stack
S5 Bending of the contacting component
S6 Attachment of an insulation sleeve
S7 Arrangement of a plastics cage
S8 Encapsulation
S9 Attachment of a tubular spring

The invention claimed is:

1. A piezo component, comprising
a piezo stack with a multiplicity of piezoelectric elements which are stacked one above the other in a direction of longitudinal extent of the piezo stack and which have interposed electrode layers for forming inner electrodes, and at least one contacting component for the electrical contacting of the piezo stack,
wherein the contacting component has an electrically conductive meandering structure for establishing electrical contact between the contacting component and the inner electrodes and has an electrically conductive contacting device for the electrical contacting of the contacting component from outside the piezo stack, wherein the meandering structure and the contacting device are arranged spaced apart from one another, wherein a connecting element is provided for the electrically conductive connection of the contacting device and of the meandering structure and for the decoupling, in terms of forces, between the contacting device and the meandering structure.

2. The piezo component as claimed in claim 1, wherein the meandering structure is arranged in direct contact with the piezo stack, and the contacting device and the connecting element are arranged so as to be spaced apart radially from the piezo stack.

3. The piezo component as claimed in claim 1, wherein the meandering structure is adhesively bonded, using conductive adhesive, to a side face of the piezo stack, or the meandering structure is soldered to an external metallic coating of the piezo stack.

4. The piezo component as claimed in claim 1, wherein the piezo stack has at least four side faces which are connected to one another via corner regions,
wherein the meandering structure is arranged on a first side face,
wherein the contacting device is arranged on a second side face which is adjacent to the first side face, and
wherein the connecting element extends around a corner region which connects the first and the second side faces.

5. The piezo component as claimed in claim 1, wherein the piezo stack has a first and a second termination region, wherein the contacting device extends beyond at least one of the termination regions, wherein the contacting device, in the region in which it extends beyond the termination region, has an insulation sleeve which extends into a spacing formed between a branch element of the contacting component and the contacting device.

6. The piezo component as claimed in claim 1, wherein two contacting components are provided, the meandering structures of which are arranged in each case on mutually opposite side faces of the piezo stack.

7. A contacting component for the electrical contacting of a piezo stack, comprising:
having an electrically conductive meandering structure for establishing electrical contact between the contacting component and inner electrodes of the piezo stack, and
an electrically conductive contacting device for the electrical contacting of the contacting component from outside the piezo stack,
wherein the meandering structure and the contacting device are arranged spaced apart from one another, wherein a connecting element is provided for the electrically conductive connection of the contacting device and of the meandering structure and for the decoupling, in terms of forces, between the contacting device and the meandering structure.

8. The contacting component as claimed in claim 7, wherein the meandering structure extends in a direction of longitudinal extent of the piezo stack, wherein the contacting device is arranged substantially parallel to the direction of longitudinal extent.

9. The contacting component as claimed in claim 7, wherein the connecting element has a multiplicity of wire elements which are connected, on a first wire element side, to the meandering structure and which are connected, on a second wire element side situated opposite the first wire element side, to the contacting device, wherein the wire elements extend substantially parallel to one another, wherein the wire elements are more particularly arranged substantially perpendicular to the direction of longitudinal extent of the meandering structure.

10. The contacting component as claimed in claim 9, wherein the wire elements are designed for the decoupling of at least one of axial, radial, lateral and torsional forces between the contacting device and the meandering structure, wherein the wire elements are arranged between the meandering structure and contacting device so as to be flexible at least in one spatial direction, wherein the wire elements are flexurally soft.

11. The contacting component as claimed in claim 8, wherein the meandering structure has, in the direction of longitudinal extent, a first end region and a second end region, wherein the contacting device protrudes at least beyond one of the end regions of the meandering structure, wherein the contacting device is in the form of a flat contact element.

12. The contacting component as claimed in claim 8, wherein the meandering structure and the contacting device and the connecting element are formed in one piece, wherein the meandering structure, the connecting element and the contacting device have a uniform thickness in a thickness direction which is arranged perpendicular to the direction of longitudinal extent of the meandering structure and perpendicular to a direction of wire extent between the contacting device and the meandering structure.

13. The contacting component as claimed claim 11, wherein on the contacting device, in a spacing region which is arranged parallel to the end region of the meandering structure beyond which the contacting device protrudes, there is arranged a branch element which extends parallel to the direction of longitudinal extent and which runs spaced apart from the contacting device with the formation of a spacing, wherein the wire elements are, in the spacing region, fastened to the branch element rather than to the contacting device.

14. A method for producing a piezo component, comprising:
a) providing a piezo stack having a multiplicity of piezoelectric elements which are stacked one above the other in a direction of longitudinal extent of the piezo stack and which have interposed electrode layers as inner electrodes, wherein the piezo stack has at least four side faces which are connected to one another via corner regions;
b) forming a contacting component having a meandering structure, a contacting device and a connecting element which electrically connects the meandering structure and the contacting device;

c) fastening the meandering structure in electrically conductive fashion to a first side face of the piezo stack such that the contacting device and the connecting element remain spaced apart from the piezo stack; and d) bending the contacting device and the connecting element against a second side face, which is adjacent to the first side face, of the piezo stack about the corner region which connects the first and the second side faces, wherein the contacting device and the connecting element remain spaced apart from the second side face and from the corner region.

15. The piezo component as claimed in claim 2, wherein the meandering structure is adhesively bonded, using conductive adhesive, to a side face of the piezo stack, or the meandering structure is soldered to an external metallic coating of the piezo stack.

16. The contacting component as claimed in claim 8, wherein the connecting element has a multiplicity of wire elements which are connected, on a first wire element side, to the meandering structure and which are connected, on a second wire element side situated opposite the first wire element side, to the contacting device, wherein the wire elements i extend substantially parallel to one another, wherein the wire elements are more particularly arranged substantially perpendicular to the direction of longitudinal extent of the meandering structure.

17. The contacting component as claimed claim 12, wherein on the contacting device, in a spacing region which is arranged parallel to the end region of the meandering structure beyond which the contacting device protrudes, there is arranged a branch element which extends parallel to the direction of longitudinal extent and which runs spaced apart from the contacting device with the formation of a spacing, wherein the wire elements are, in the spacing region, fastened to the branch element rather than to the contacting device.

18. The contacting component as claimed in claim 10, wherein the wire elements are arranged between the meandering structure and contacting device so as to be flexible in two spatial directions.

19. The contacting component as claimed in claim 10, wherein the wire elements are arranged between the meandering structure and contacting device so as to be flexible in three spatial directions.

* * * * *